(12) United States Patent
Park et al.

(10) Patent No.: US 10,192,685 B2
(45) Date of Patent: *Jan. 29, 2019

(54) MULTILAYER CAPACITOR AND BOARD HAVING THE SAME MOUNTED THEREON

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Se Hun Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,601

(22) Filed: Jul. 10, 2017

(65) Prior Publication Data

US 2018/0144868 A1 May 24, 2018

(30) Foreign Application Priority Data

Nov. 23, 2016 (KR) .................. 10-2016-0156573

(51) Int. Cl.
*H01G 4/30* (2006.01)
*H01G 4/228* (2006.01)
(Continued)

(52) U.S. Cl.
CPC ............... *H01G 4/30* (2013.01); *H01G 4/005* (2013.01); *H01G 4/228* (2013.01); *H05K 1/181* (2013.01);
(Continued)

(58) Field of Classification Search
CPC .......... H01G 4/30; H01G 4/005; H01G 4/228; H05K 1/181
(Continued)

(56) References Cited

U.S. PATENT DOCUMENTS 6,320,738 B1 11/2001 Yamana et al.
6,522,521 B2 2/2003 Mizuno et al.
(Continued)

FOREIGN PATENT DOCUMENTS

JP 2014-27085 A 2/2014
JP 2014-36149 A 2/2014
(Continued)

*Primary Examiner* — Timothy J Thompson
*Assistant Examiner* — Charles Pizzuto
(74) *Attorney, Agent, or Firm* — McDermott Will & Emery LLP

(57) ABSTRACT

A multilayer capacitor includes a capacitor body including a plurality of first and second internal electrodes alternately disposed therein and a dielectric layer interposed therebetween, and having first to sixth surfaces, opposing each other, respectively; a plurality of external electrodes connected to the first and second internal electrodes; an insulating layer disposed on the first surface; first and second terminal electrodes spaced apart from each other in a direction in which the third and fourth surfaces are connected, on the insulating layer; and a connecting member electrically connecting the first and second terminal electrodes and the external electrodes.

13 Claims, 12 Drawing Sheets

(51) Int. Cl.
*H01G 4/005* (2006.01)
*H05K 1/18* (2006.01)
*H05K 3/34* (2006.01)
(52) U.S. Cl.
CPC ..... *H05K 3/3442* (2013.01); *H05K 2201/049* (2013.01); *H05K 2201/10015* (2013.01)
(58) Field of Classification Search
USPC ........................................................ 174/260
See application file for complete search history.

(56) References Cited

U.S. PATENT DOCUMENTS

| | | | |
|---|---|---|---|
| 7,659,568 | B2 | 2/2010 | Kusano et al. |
| 7,745,869 | B2 | 6/2010 | Sakashita |
| 8,050,045 | B2 | 11/2011 | Okuzawa et al. |
| 8,631,549 | B2 | 1/2014 | Motoki et al. |
| 9,208,949 | B2 * | 12/2015 | Ahn ............ H01G 4/224 |
| 2012/0134066 | A1 | 5/2012 | Kim et al. |
| 2014/0345926 | A1 * | 11/2014 | Lee ............ H01G 4/30 |
| | | | 174/260 |
| 2015/0124370 | A1 * | 5/2015 | Ahn ............ H01G 4/224 |
| | | | 361/272 |
| 2016/0020031 | A1 * | 1/2016 | Shin ............ H01G 4/38 |
| | | | 174/260 |

FOREIGN PATENT DOCUMENTS

| | | |
|---|---|---|
| KR | 10-2012-0031235 A | 3/2012 |
| KR | 10-2012-0056549 A | 6/2012 |
| KR | 10-1499717 B1 | 3/2015 |
| KR | 10-2015-0051667 A | 5/2015 |
| WO | 2011/002982 A2 | 1/2011 |

* cited by examiner

I-I'

MULTILAYER CAPACITOR AND BOARD HAVING THE SAME MOUNTED THEREON

CROSS-REFERENCE TO RELATED APPLICATION(S)

This application is based on and claims the benefit of priority to Korean Patent Application No. 10-2016-0156573 filed on Nov. 23, 2016 with the Korean Intellectual Property Office, the entire disclosure of which is incorporated herein by reference.

TECHNICAL FIELD

The present disclosure relates to a multilayer capacitor and a board having the same mounted thereon.

BACKGROUND

Multilayer ceramic capacitors, multilayer chip electronic components, are chip-type condensers installed on the printed circuit boards of various electronic products, for example, image display devices such as liquid crystal displays (LCDs), plasma display panels (PDPs) or the like, computers, personal digital assistants (PDAs), mobile phones, and the like, to charge or discharge electricity.

Such multilayer ceramic capacitors (MLCCs), having positive attributes such as compactness, guaranteed high capacitance, and ease in the mounting thereof, may be used as components in various electronic devices.

Such an MLCC may have a structure in which a plurality of dielectric layers and internal electrodes are alternately disposed in such a manner that the internal electrodes having different polarities are provided between the dielectric layers.

The dielectric layers have piezoelectric and electrostrictive properties. Thus, when a direct current (DC) or alternating current (AC) voltage is applied to an MLCC, a piezoelectric phenomenon may occur between internal electrodes, thereby causing the occurrence of vibrations.

Vibrations may be transferred to boards on which MLCCs are mounted, through external electrodes of the MLCCs, leading to the entirety of the boards acting as acoustically radiating surfaces to generate vibratory sound as noise.

Vibratory sound may correspond to audio frequencies ranging from 20 Hz to 20,000 Hz, causing listener discomfort, and such a vibratory sound, which may cause listener discomfort, is commonly known as acoustic noise.

As low noise design of electronic products has come to prominence, acoustic noise generated in MLCCs has become an issue. In particular, reductions of acoustic noise in electronic products having a voice communications function, such as smartphones, have been required.

SUMMARY

An aspect of the present disclosure is to provide a multilayer capacitor in which acoustic noise may be reduced by decreasing piezoelectric vibrations, and a board having the same mounted thereon.

According to an aspect of the present disclosure, a multilayer capacitor includes a capacitor body including a plurality of first and second internal electrodes alternately disposed therein and a dielectric layer interposed therebetween, and having a first surface and a second surface opposing each other, a third surface and a fourth surface opposing each other and connected to the first and second surfaces and, and a fifth surface and a sixth surface opposing each other and connected to the first to fourth surfaces; a plurality of external electrodes connected to the plurality of first and second internal electrodes; an insulating layer disposed on the first surface of the capacitor body; a first terminal electrode and a second terminal electrode disposed on the insulating layer and spaced apart from each other in a direction in which the third and fourth surfaces are connected to each other; and a connecting member electrically connecting the first and second terminal electrodes and the plurality of external electrodes to each other.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Figure 1A:
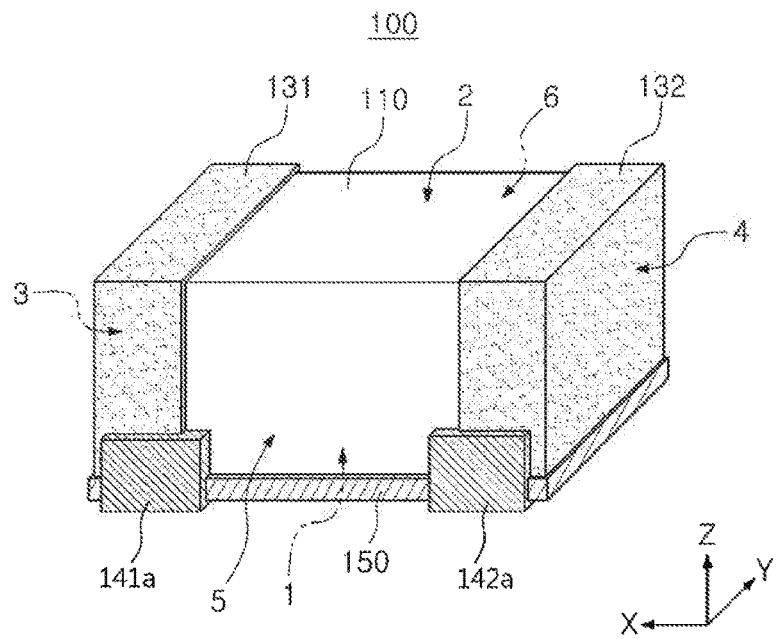
FIGS. 1A and 1B are schematic perspective views of a multilayer capacitor according to a first embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "above," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout.

It will be apparent that though the terms first, second, third, etc. may be used herein to describe various members, components, regions, layers and/or sections, these members, components, regions, layers and/or sections should not be construed as being limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is inverted, elements described as "above" with regard to other elements, or "upper," would then be oriented "below" with regard to the other elements or features, or "lower." Thus, the term "above" can encompass both upward and downward orientations, depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape illustrated may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and only a required configuration is proposed herein, but an exemplary embodiment in the present disclosure is not limited thereto.

For example, when the direction of a capacitor body is defined to clearly illustrate exemplary embodiments in the present invention, X, Y and Z illustrated in the drawings represent a length direction, a width direction, and a thickness direction, respectively. In this case, the thickness direction may be the same direction as a lamination direction in which dielectric layers and internal electrodes are laminated.

In this exemplary embodiment, for convenience of explanation, two surfaces of a capacitor body 110 of a multilayer capacitor, opposing each other in a Z direction, are set to be first and second surfaces 1 and 2; two surfaces thereof connecting edges of the first and second surfaces 1 and 2 to each other while opposing each other in an X direction are set to be third and fourth surfaces 3 and 4; and two surfaces thereof, connecting edges of the first and second surfaces 1 and 2 and edges of the third and fourth surfaces 3 and 4 to each other, respectively, while opposing each other in a Y direction, are set to be fifth and sixth surfaces 5 and 6, which will be described below. In this case, the first surface 1 may be used as a mounting surface.

Multilayer Capacitor

Figure 1B:
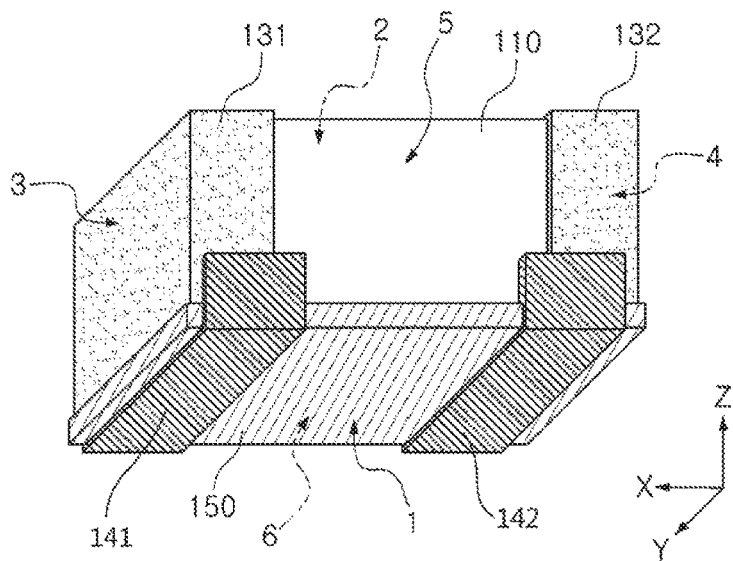
Figure 2A:
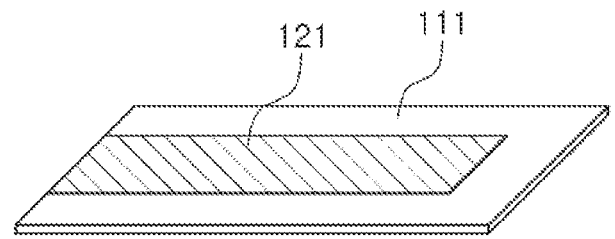
FIGS. 2A and 2B are perspective views illustrating first and second internal electrodes in a multilayer capacitor according to the first embodiment in the present disclosure, respectively.
Figure 2B:
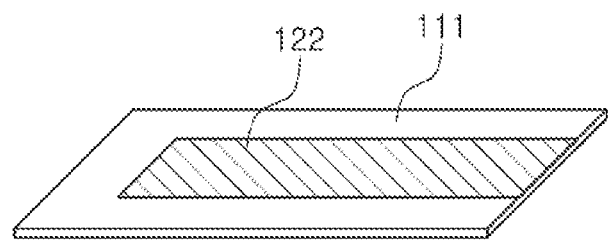
Figure 3:
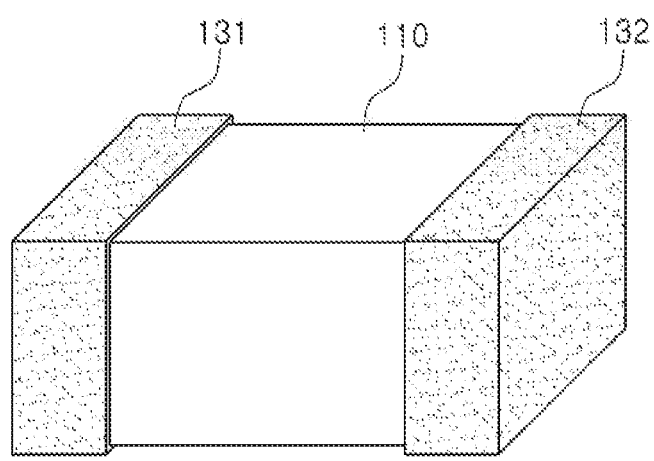
FIG. 3 is a perspective view illustrating first and second external electrodes disposed on a capacitor body of a multilayer capacitor according to the first embodiment in the present disclosure.
Figure 4A:
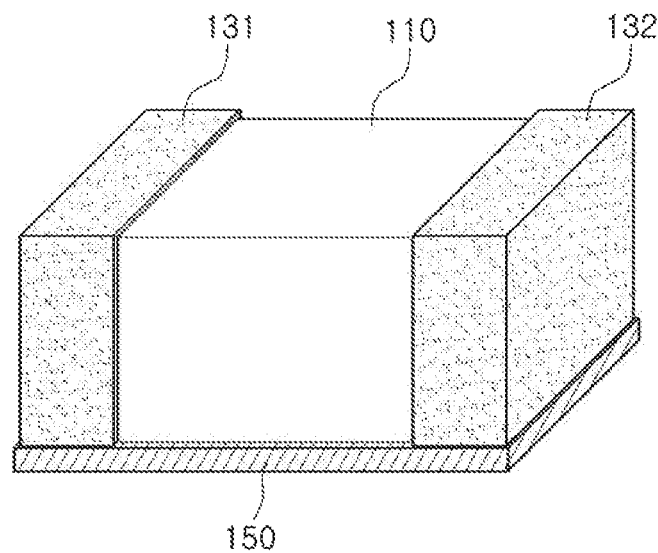
FIGS. 4A and 4B are perspective views illustrating an insulating layer further disposed on the capacitor body of FIG. 3.
Figure 4B:
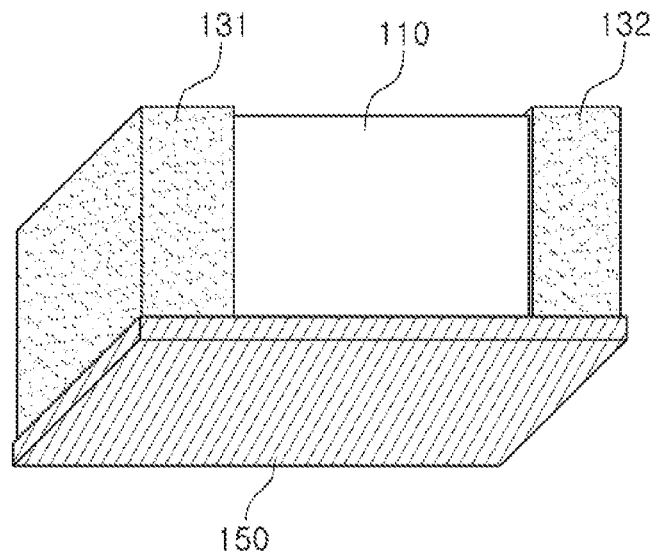

FIGS. 1A and 1B are schematic perspective views of a multilayer capacitor according to a first embodiment of the present disclosure. FIGS. 2A and 2B are perspective views illustrating first and second internal electrodes, respectively, in a multilayer capacitor according to the first embodiment. FIG. 3 is a perspective view illustrating first and second external electrodes disposed on a capacitor body of a multilayer capacitor according to the first embodiment. FIGS. 4A and 4B are perspective views illustrating an insulating layer further disposed on a surface of the capacitor body of FIG. 3.

With reference to FIGS. 1A to 4B, a multilayer capacitor 100 according to a first embodiment of the present disclosure may include a capacitor body 110 including a dielectric layer 111 and a plurality of first and second internal electrodes 121 and 122; first and second external electrodes 131 and 132; an insulating layer 150 disposed on the first surface 1 of the capacitor body 110; first and second terminal electrodes 141 and 142 disposed on the insulating layer 150 and spaced apart from each other in the X direction; a first extension 141a and a second extension (not shown) electrically connecting the first external electrode 131 and the first terminal electrode 141; and a third extension 142a and a fourth extension (not shown) electrically connecting the second external electrode 132 and the second terminal electrode 142.

The capacitor body 110 may be formed by laminating a plurality of dielectric layers 111, and the capacitor body 110 may have, but not particularly limited thereto, a substantially hexahedral shape as illustrated in the drawings.

A shape and dimensions of the capacitor body 110 and the number of laminated layers of the dielectric layer 111 are not limited to those illustrated in the drawings.

Further, the dielectric layer 111 may be in a sintered state. In this case, adjacent dielectric layers 111 may be integrated, such that it may be difficult to distinguish boundaries therebetween without using a scanning electron microscope (SEM).

The capacitor body 110 may include an active region including the first and second internal electrodes 121 and 122, serving as a portion contributing to capacitance formation of a capacitor, and cover regions disposed on upper and lower portions of the active region in the Z direction, as margin portions.

The active region may be formed by repeatedly laminating a plurality of the first and second internal electrodes 121 and 122 and have a dielectric layer 111 interposed therebetween.

In this case, a thickness of the dielectric layer 111 may be arbitrarily changed, according to a capacitance design of the multilayer capacitor 100.

The dielectric layer 111 may include a ceramic powder having a high dielectric constant, for example, a barium titanate ($BaTiO_3$)-based or strontium titanate ($SrTiO_3$)-based powder, but is not limited thereto.

Further, one or more of a ceramic additive, an organic solvent, a plasticizer, a binder and a dispersing agent may be added to the dielectric layer 111, together with the ceramic powder.

The cover regions may be located on the upper and lower portions of the capacitor body 110 in the Z direction, and may have the same material and configuration as those of the dielectric layer 111, except that the cover regions do not include an internal electrode.

The cover regions may be formed by laminating a single dielectric layer 111 or two or more dielectric layers 111 on the upper and lower portions of the active region in the Z direction, respectively. The cover regions may basically serve to prevent the first and second internal electrodes 121 and 122 from being damaged due to physical or chemical stress.

The first and second internal electrodes 121 and 122 may have different polarities.

An area of an overlapped region of the first and second internal electrodes 121 and 122 alternately disposed in the capacitor body 110 in the Z direction and having the dielectric layer 111 interposed therebetween may be relevant to the capacitance formation of the capacitor.

The first and second internal electrodes 121 and 122 may be formed by printing a conductive paste containing a conductive metal of a predetermined thickness on the dielectric layer 111, and may be electrically insulated by the dielectric layer 111 disposed between the first and second internal electrodes 121 and 122.

The conductive metal included in the conductive paste may be, for example, nickel (Ni), copper (Cu), palladium (Pd) or alloys thereof, but is not limited thereto.

The conductive paste may be manufactured by a screen printing method, a gravure printing method, or the like, but the present disclosure is not limited thereto.

One end of the first internal electrode 121 in the X direction may be exposed to the third surface 3 of the capacitor body 110, and one end of the second internal electrode 122 in the X direction may be exposed to the fourth surface 4 of the capacitor body 110.

The first and second external electrodes 131 and 132 may be a conductive paste containing a conductive metal and glass. The conductive metal may be nickel (Ni), copper (Cu), palladium (Pd), gold (Au), or alloys thereof, but is not limited thereto.

The first and second external electrodes 131 and 132 may include first and second connecting portions formed on the third and fourth surfaces 3 and 4 of the capacitor body 110 to be connected to the exposed ends of the first and second internal electrodes 121 and 122, and first and second band portions extending from a circumference of the first and second connecting portions in the X direction to be connected to portions of the first and second surfaces 1 and 2 and portions of the fifth and sixth surfaces 5 and 6 of the capacitor body 110.

The first and second terminal electrodes 141 and 142 may be spaced apart from each other in the X direction on the insulating layer 150.

The first and second terminal electrodes 141 and 142 may include a connecting member that comprises the first 141a, second 142a, third and fourth (not shown) extensions extending from both ends of each first and second terminal electrode 141 and 142 to be connected to portions of the first and second band portions of the first and second external electrodes 131 and 132, formed on the fifth and sixth surfaces, respectively.

The insulating layer 150 may be formed of one or more selected from a thermosetting resin such as an epoxy, an insulating ceramic, and an insulating resin and a filler, but is not limited thereto.

In the exemplary embodiment, the insulating layer 150 may cover the entirety of the first surface 1 of the capacitor body 110 and portions of lower sides of the third to sixth surfaces 3 to 6.

Figure 5A:
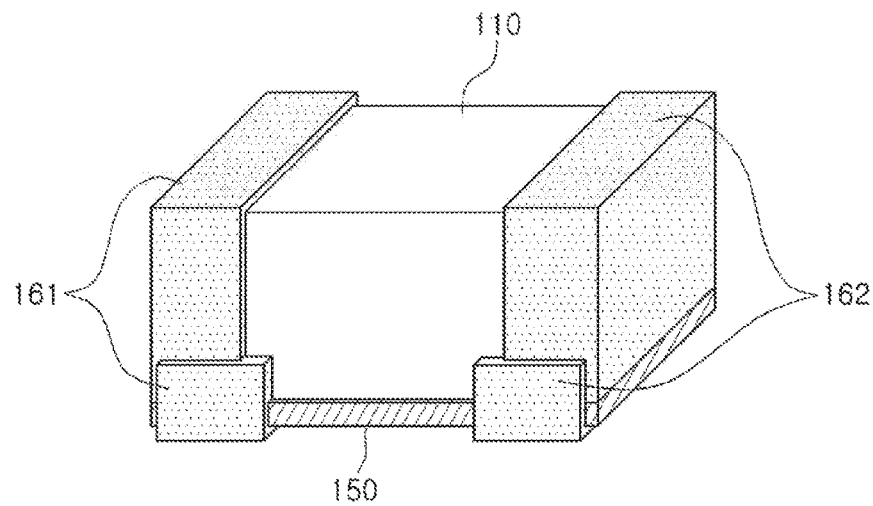
FIGS. 5A and 5B are perspective views illustrating a plating layer further disposed in FIG. 1.
Figure 5B:
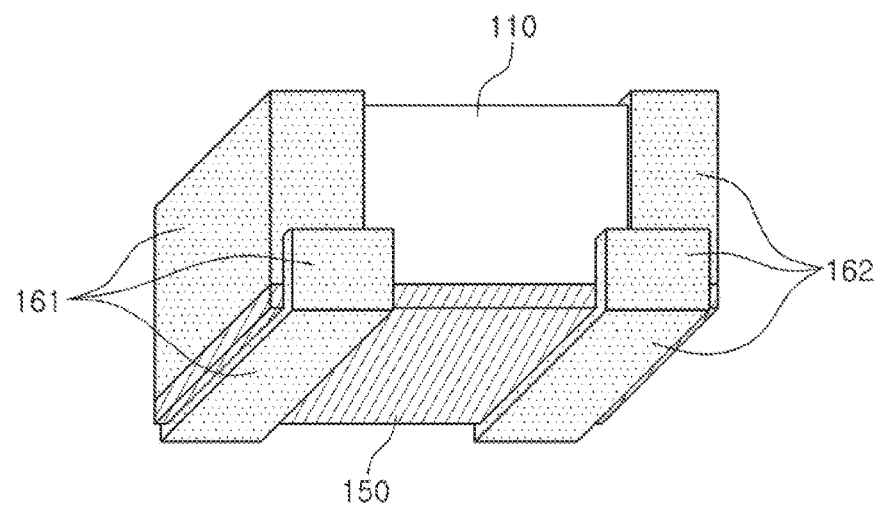

As illustrated in FIGS. 5A and 5B, the multilayer capacitor according to the exemplary embodiment may further include plating layers 161 and 162 formed on the first and second external electrodes 131 and 132, the first and second terminal electrodes 141 and 142, and the first and second extensions 141a and 142a.

In this case, the plating layers 161 and 162 may have a structure in which a nickel (Ni) plating layer and a tin (Sn) plating layer are sequentially laminated, but is not limited thereto.

Variation Example

Figure 6A:
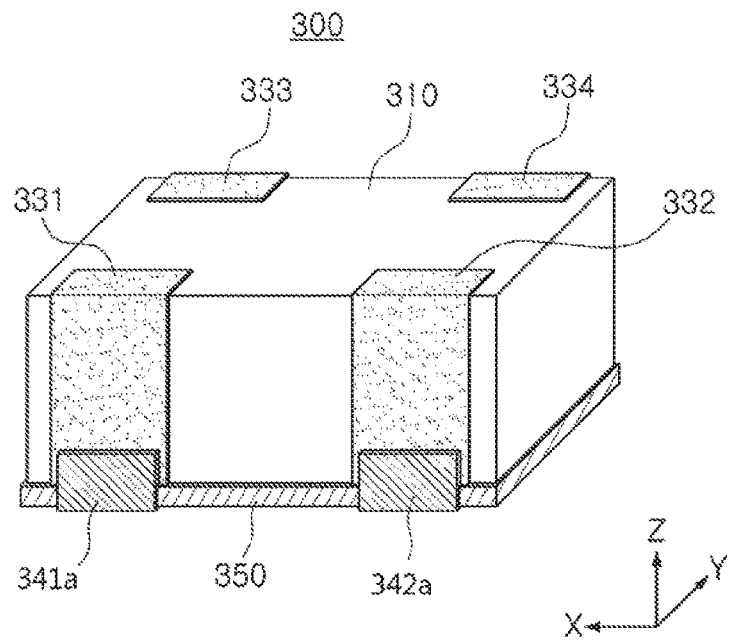
FIGS. 6A and 6B are schematic perspective views of a multilayer capacitor according to a second embodiment in the present disclosure.
Figure 6B:
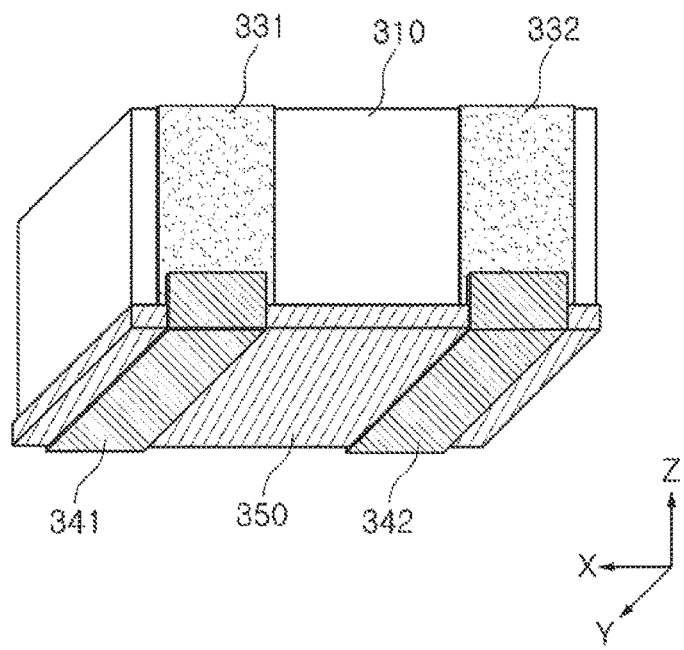
Figure 7A:
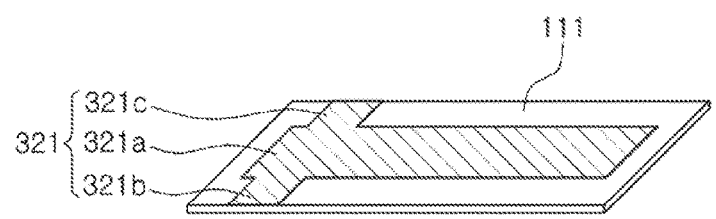
FIGS. 7A and 7B are perspective views illustrating first and second internal electrodes in a multilayer capacitor according to the second embodiment in the present disclosure, respectively.
Figure 7B:
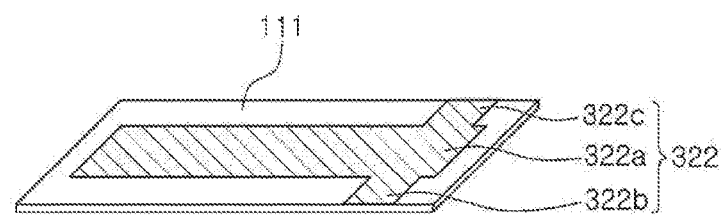
Figure 8:
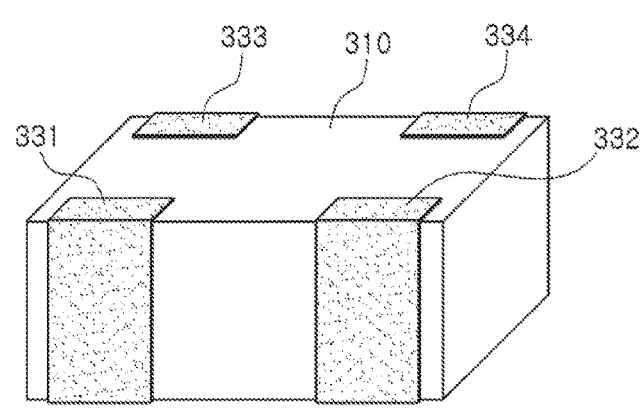
FIG. 8 is a perspective view illustrating first to fourth external electrodes disposed on a capacitor body of a multilayer capacitor according to the second embodiment in the present disclosure.
Figure 9A:
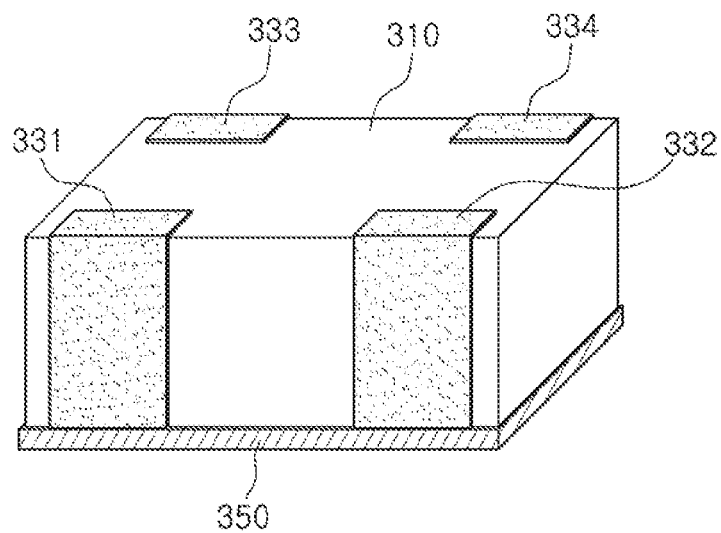
FIGS. 9A and 9B are perspective views illustrating an insulating layer further disposed on the capacitor body of FIG. 8.
Figure 9B:
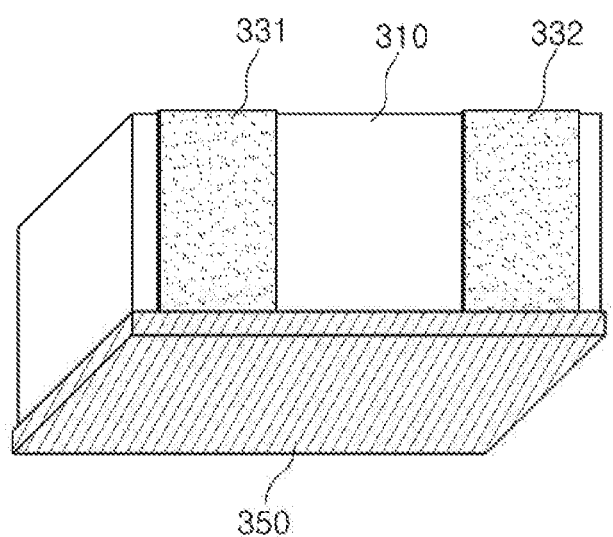

FIGS. 6A and 6B are schematic perspective views of a multilayer capacitor 300 according to a second embodiment of the present disclosure. FIGS. 7A and 7B are perspective views illustrating first and second internal electrodes, respectively, in the multilayer capacitor 300 according to the second embodiment. FIG. 8 is a perspective view illustrating first to fourth external electrodes disposed on a capacitor body of the multilayer capacitor 300 according to the second embodiment. FIGS. 9A and 9B are perspective views illustrating an insulating layer further disposed on the capacitor body of FIG. 8.

In this case, since the structures of a dielectric layer 111, an insulating layer 350, and first and second terminal electrodes 341 and 342 are similar to those in the first embodiment described above, detailed descriptions thereof will be omitted to avoid overlapped descriptions.

With reference to FIGS. 6A to 9B, a first internal electrode 321 may include a first body portion 321a spaced apart from an end portion of a capacitor body 310, and first and second lead-out portions 321b and 321c extending from the first body portion 321a to be respectively exposed to the fifth and sixth surfaces 5 and 6 of the capacitor body 100. In this case, the first internal electrode 321 may be spaced apart from the third surface 3 of the capacitor body 310.

The second internal electrode 322 may include a second body portion 322a spaced apart from an end portion of the capacitor body 310 and to be overlapped with the first body portion 321a in the Z direction, and third and fourth lead-out portions 322b and 322c extending from the second body portion 322a to be respectively exposed to the fifth and sixth surfaces 5 and 6 of the capacitor body 310. In this case, the first internal electrode 322 may be spaced apart from the fourth surface 4 of the capacitor body 310.

The third lead-out portion 322b may be spaced apart from the first lead-out portion 321b in the X direction, and the fourth lead-out portion 322c may be spaced apart from the second lead-out portion 321c in the X direction.

The multilayer capacitor 300 according to the second embodiment may include first to fourth external electrodes 331 to 334.

The first external electrode 331 may be formed on the fifth surface 5 of the capacitor body 310, and may be connected to the first lead-out portion 321b of the first internal electrode 321. In this case, the first external electrode 331 may be formed in such a manner that both ends of the first external electrode 331 extend to contact portions of the first and second surfaces 1 and 2 of the capacitor body 310.

The second external electrode 332 may be formed on the fifth surface 5 of the capacitor body 310 and spaced apart from the first external electrode 331 in the X direction, and may be connected to the third lead-out portion 322b of the second internal electrode 322. In this case, the second external electrode 332 may be formed in such a manner that both ends thereof extend to contact portions of the first and second surfaces 1 and 2 of the capacitor body 310.

The third external electrode 333 may be formed on the sixth surface 6 of the capacitor body 310, and may be connected to the second lead-out portion 321c of the first internal electrode 321. In this case, the third external electrode 333 may be formed in such a manner that both ends thereof extend to be connected to portions of the first and second surfaces 1 and 2 of the capacitor body 310.

The fourth external electrode 334 may be formed on the sixth surface 6 of the capacitor body 310 and spaced apart from the third external electrode 333 in the X direction, and may be connected to the fourth lead-out portion 322c of the second internal electrode 322. In this case, the fourth external electrode 334 may be formed in such a manner that both ends thereof extend to be connected to portions of the first and second surfaces 1 and 2 of the capacitor body 310.

The first and second terminal electrodes 341 and 342 may include a connecting member that includes a first extension 341a and a second extension (not shown) extending from one ends of the first and second terminal electrodes 341 and 342 to be connected to the first and second external electrodes 331 and 332.

The connecting member may further include a third extension 342a and a fourth extension (not shown) extending from opposite ends of the first and second terminal electrodes to be connected to the third and fourth external electrodes 333 and 334.

Figure 10A:
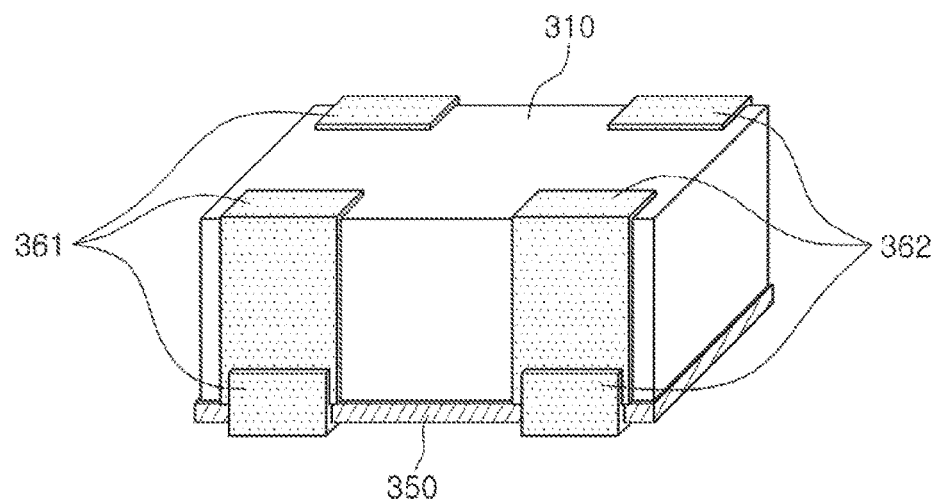
FIGS. 10A and 10B are perspective views illustrating a plating layer further disposed in FIG. 6.
Figure 10B:
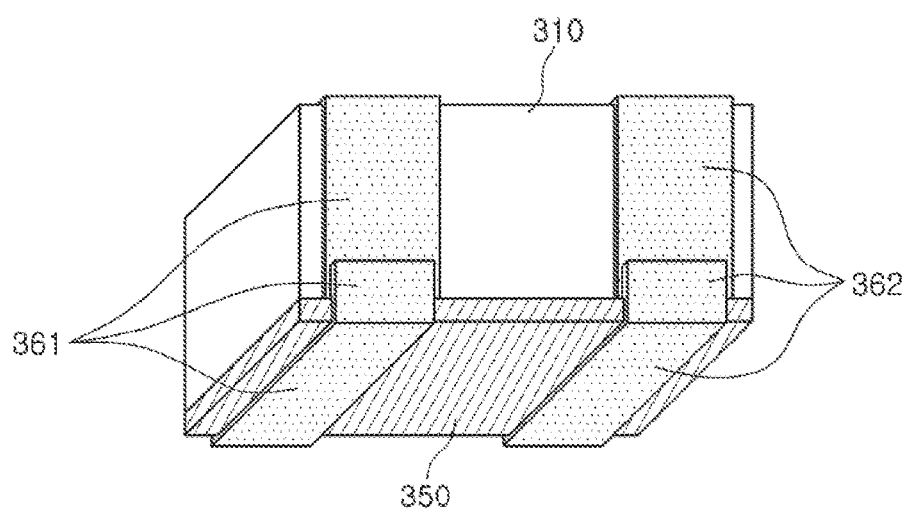

As illustrated in FIGS. 10A and 10B, the multilayer capacitor 300 according to the exemplary embodiment may further include plating layers 361 and 362 formed on the first to fourth external electrodes 331 to 334, the first and second terminal electrodes 341 and 342, and the first to fourth extensions.

In this case, the plating layers 361 and 362 may have a structure in which a nickel (Ni) plating layer and a tin (Sn) plating layer are sequentially laminated, but is not limited thereto.

Figure 11:
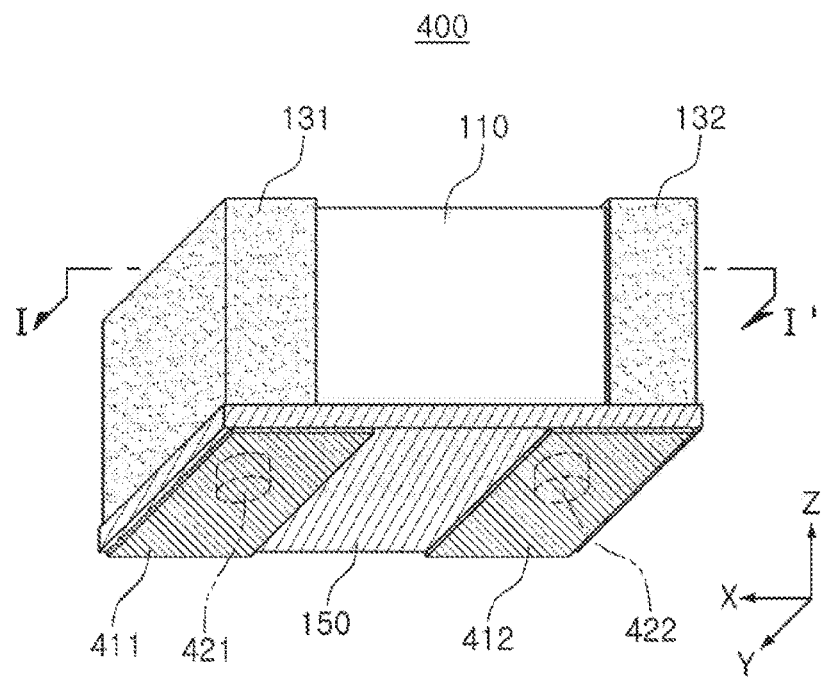
FIG. 11 is a schematic perspective view of a multilayer capacitor according to a third embodiment in the present disclosure.
Figure 12:
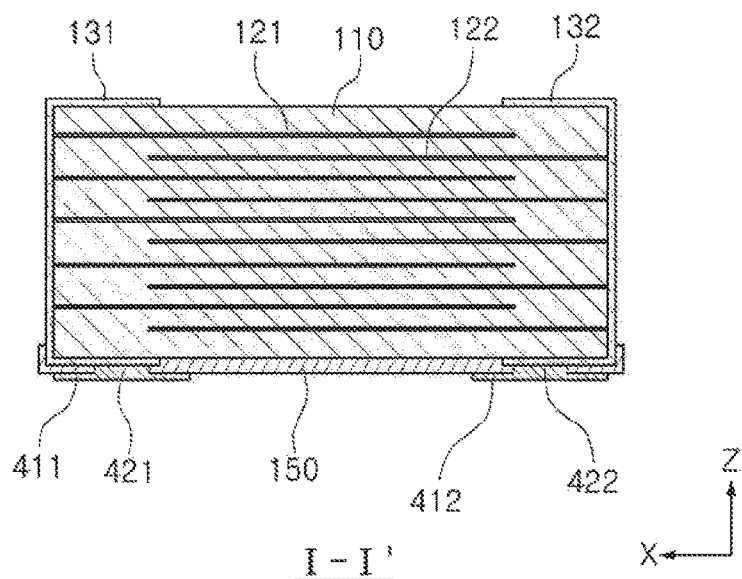
FIG. 12 is a cross-sectional view taken along line I-I' of FIG. 11 in X-Z directions.

FIG. 11 is a schematic perspective view of a multilayer capacitor according to a third embodiment of the present disclosure. FIG. 12 is a cross-sectional view taken along line I-I' of FIG. 11 in the X-Z directions.

In this case, since the structures of a dielectric layer 111, first and second internal electrodes 121 and 122, first and second external electrodes 131 and 132, an insulating layer 150, and first and second terminal electrodes 411 and 412 are similar to those in the first embodiment described above, detailed descriptions thereof will be omitted to avoid overlapped descriptions.

With reference to FIGS. 11 and 12, a multilayer capacitor 400 according to the exemplary embodiment may include first and second via electrodes 421 and 422.

First and second through holes (not shown) may be formed in the insulating layer 150 to expose portions of first and second band portions of the first and second external electrodes 131 and 132.

The first via electrode 421 may be formed to penetrate through the insulating layer 150 from the first terminal electrode 411 through the first through hole, to be connected to a portion of the first band portion of the first external electrode 131, formed on the first surface 1 of the capacitor body 110.

The second via electrode 422 may be formed to penetrate through the insulating layer 150 from the second terminal electrode 412 through the second through hole, to be connected to a portion of the second band portion of the second external electrode 132, formed on the first surface 1 of the capacitor body 110.

In the exemplary embodiment, the insulating layer 150 may be formed to cover entire portions of the first surface 1 of the capacitor body 110, except portions of the first surface 1 through which the first and second via electrodes 421 and 422 penetrate.

In addition, a plating layer may further be formed on the first and second external electrodes 131 and 132 and the first and second terminal electrodes 411 and 412.

In this case, the plating layer may have a structure in which a nickel (Ni) plating layer and a tin (Sn) plating layer are sequentially laminated, but is not limited thereto.

According to the exemplary embodiment, since the terminal electrodes are only formed on a mounting surface of the capacitor body on which a relatively small amount of piezoelectric vibrations occur in the capacitor body, when the multilayer capacitor 300 is mounted on a substrate, an area of solder may be reduced. Thus, vibrations transferred from the multilayer capacitor 300 to the substrate may be reduced, thereby further reducing acoustic noise.

Board Having Multilayer Capacitor Mounted Thereon

Figure 13:
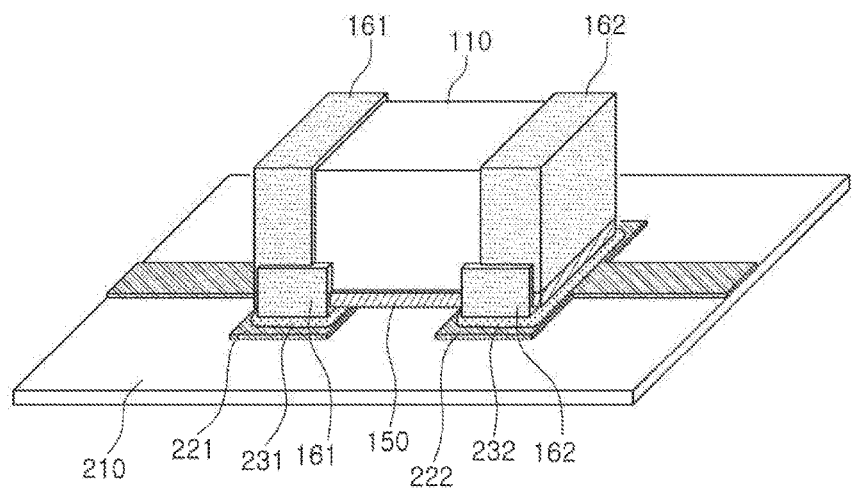
FIG. 13 is a perspective view illustrating a state in which the multilayer capacitor of FIG. 5A is mounted on a substrate.

With reference to FIG. 13, a board having a multilayer capacitor mounted thereon according to an exemplary embodiment may include a substrate 210 on which a multilayer capacitor is mounted, and first and second electrode pads 221 and 222 spaced apart from each other in an X direction on the substrate 210.

In the case of the multilayer capacitor described above, plating layers 161 and 162 formed on first and second terminal electrodes may be fixed to the first and second electrode pads 221 and 222 by solders 231 and 232 in a state in which the plating layers 161 and 162 formed on the first and second terminal electrodes are in contact with the first and second electrode pads 221 and 222, respectively, and thus, the multilayer capacitor may be electrically connected to the substrate 210.

Figure 14:
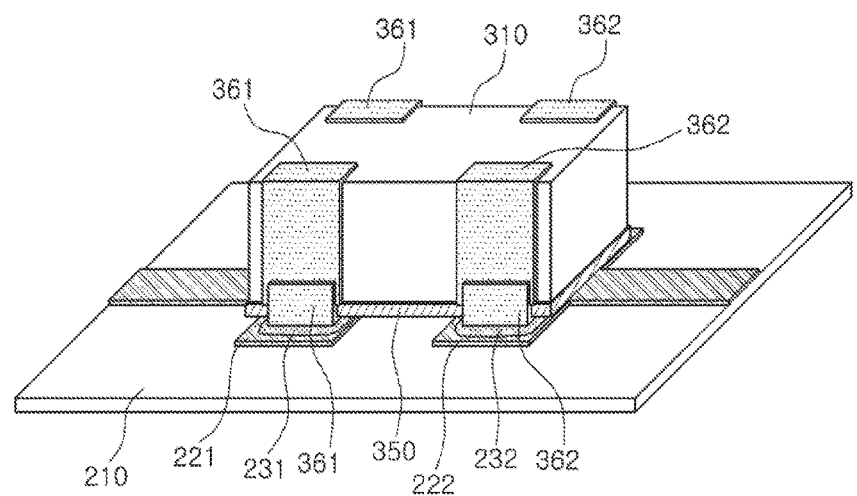
FIG. 14 is a perspective view illustrating a state in which the multilayer capacitor of FIG. 10A is mounted on a substrate.

FIG. 14 is a perspective view illustrating a state in which the multilayer capacitor of FIG. 10A is mounted on a substrate. In this case, since configurations other than a structure of the multilayer capacitor are similar to those in the foregoing exemplary embodiment, a detailed description thereof will be omitted.

Although not illustrated in the drawings, the multilayer capacitor of FIG. 11 may also be mounted on a substrate in a structure similar thereto.

Figure 15:
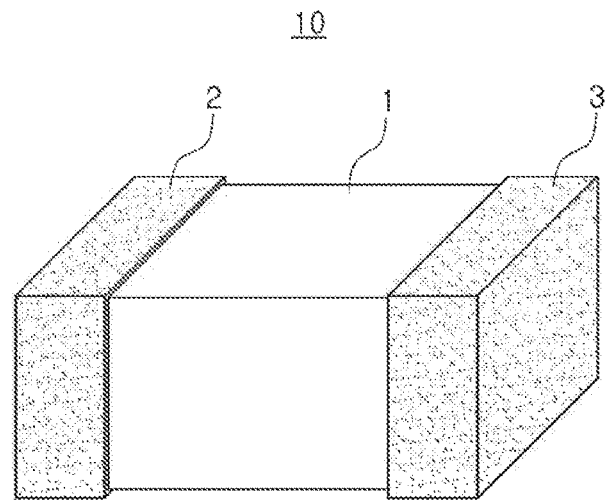
FIG. 15 is a perspective view of a multilayer capacitor according to the related art.
Figure 16:
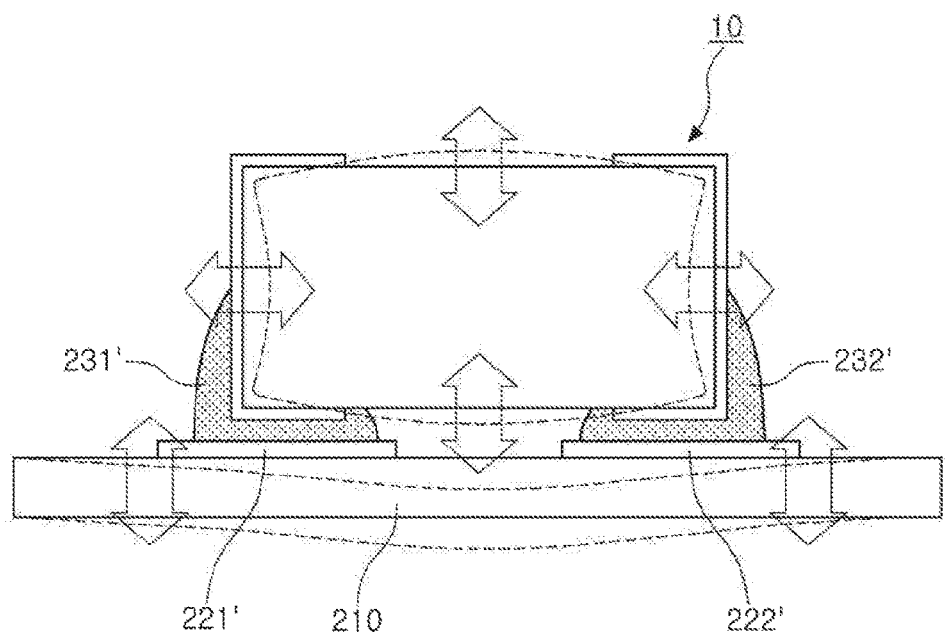
FIG. 16 is a cross-sectional view schematically illustrating vibrations of the multilayer capacitor of FIG. 15 in a state in which the multilayer capacitor is mounted on a substrate.
Figure 17:
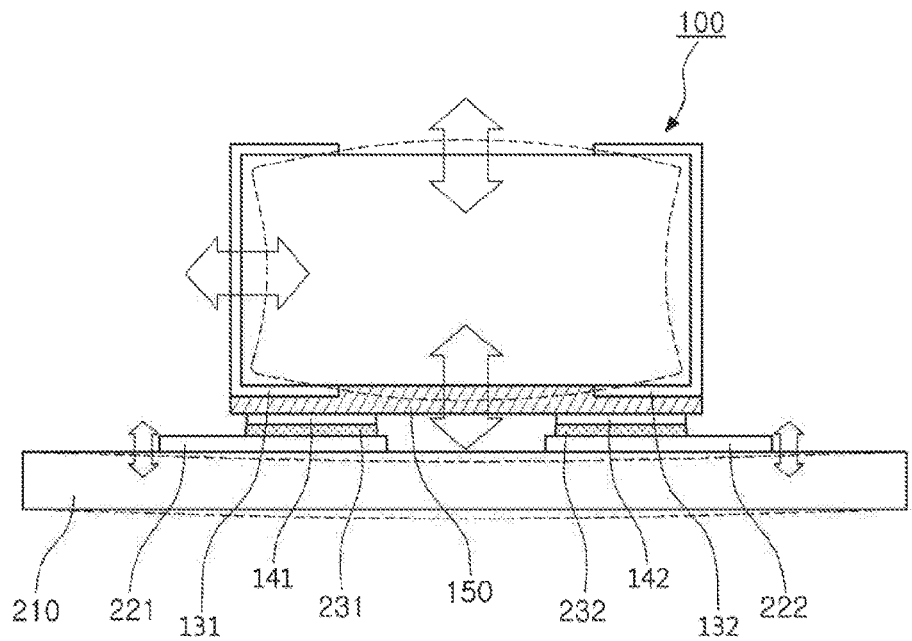
FIG. 17 is a schematic cross-sectional view illustrating vibrations in FIG. 13.

FIG. 15 is a perspective view of a multilayer capacitor 10 according to the related art, and illustrates a structure in which external electrodes 2 and 3 are formed on both end portions of a capacitor body 1. FIG. 16 is a cross-sectional view schematically illustrating vibrations of the multilayer capacitor of FIG. 15 in a state in which the multilayer capacitor is mounted on a substrate. FIG. 17 is a schematic cross-sectional view illustrating vibrations in FIG. 13.

Referring to FIG. 16, in the case of the multilayer capacitor 10 according to the related art, since solders 231' and 232' formed on the first and second electrode pads 221' and 222' have a relatively large area, an amount of vibrations transferred to the substrate 210 through the external electrodes 2 and 3 may be relatively great.

However, with reference to FIG. 17, in the case of the multilayer capacitor 100 according to an exemplary embodiment of the present disclosure, the areas of the solders 231 and 232 formed on the first electrode pad 221 and the second electrode pad 222 are relatively low, as compared with those in the example of the related art in FIG. 16, and piezoelectric vibrations may be absorbed by elastic force of the insulating layer 150 formed between the first and second external electrodes 131 and 132 and the first and second terminal electrodes 141 and 142. Thus, piezoelectric vibrations transferred to a substrate 210 may be reduced, thereby reducing acoustic noise.

As mechanical stress caused by thermal shock, deformation of the substrate 210, or the like may be relieved or suppressed by elastic force of the insulating layer 150 and the first and second terminal electrodes 141 and 142 formed of a conductive resin, damage to the capacitor body 110 may be prevented, and thus, reliability of the multilayer capacitor 100 may be improved.

Figure 18:
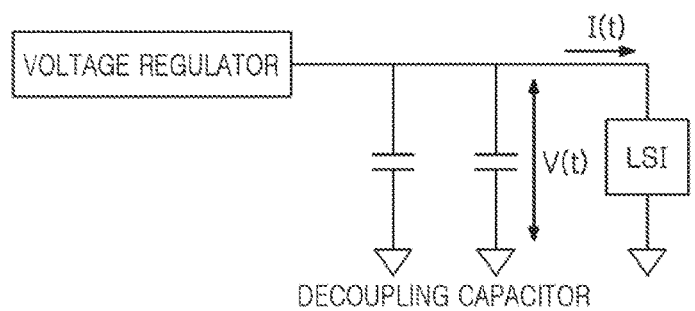
FIG. 18 is a schematic circuit diagram illustrating an exemplary embodiment of the present disclosure in which a multilayer capacitor is used as a decoupling capacitor of a power supply circuit of a large scale integration (LSI)
Figure 19:
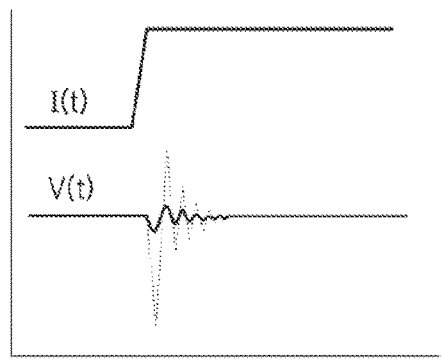
FIG. 19 is a graph illustrating a change in current and a change in voltage in the power supply circuit of FIG. 18.

FIG. 18 is a schematic circuit diagram illustrating an exemplary embodiment of the present disclosure in which a multilayer capacitor is used as a decoupling capacitor of a power supply circuit of a LSI. FIG. 19 is a graph illustrating changes in current and voltage in the power supply circuit of FIG. 18.

With reference to FIGS. 18 and 19, a plurality of decoupling capacitors disposed between a voltage regulator and the LSI may absorb a sudden and large change in current flowing in the LSI and voltage variations caused by wiring inductance, thereby stabilizing a voltage. In this case, a possibility that antiresonance may occur between capacitors and impedance may be increased may be present.

However, for example, when a multilayer capacitor according to the exemplary embodiment is used as a decoupling capacitor used in an LSI power supply circuit, a current path may be reduced by a terminal electrode formed on a mounting surface of a capacitor body portion, and thus, ESL may be reduced.

Thus, current change, and voltage variation caused by wiring inductance, may be absorbed, thereby significantly reducing power impedance. In addition, stability of a system against LSI power noise may be significantly improved.

As set forth above, acoustic noise may be reduced by decreasing piezoelectric vibrations of a multilayer capacitor.

While exemplary embodiments have been shown and described above, it will be apparent to those skilled in the art that modifications and variations could be made without departing from the scope of the present invention as defined by the appended claims.

What is claimed is:
1. A multilayer capacitor comprising:
    a capacitor body including a plurality of first and second internal electrodes alternately disposed therein and a dielectric layer interposed therebetween, the capacitor body having a first surface and a second surface opposing each other, a third surface and a fourth surface opposing each other and connected to the first and second surfaces, and a fifth surface and a sixth surface opposing each other and connected to the first to fourth surfaces;
    a plurality of external electrodes connected to the plurality of first and second internal electrodes;
    an insulating layer disposed on the first surface of the capacitor body;
    a first terminal electrode and a second terminal electrode disposed on the insulating layer and spaced apart from each other in a direction in which the third and fourth surfaces are connected to each other; and
    a connecting member electrically connecting the first and second terminal electrodes and the plurality of external electrodes to each other.

2. The multilayer capacitor of claim 1, wherein the plurality of first and second internal electrodes are exposed to the third and fourth surfaces of the capacitor body, respectively,
    the plurality of external electrodes comprise:
        a first external electrode including a first connecting portion disposed on the third surface of the capacitor body to be connected to the plurality of the first internal electrodes, and a first band portion extending from a circumference of the first connecting portion to be connected to portions of the first and second surfaces and portions of the fifth and sixth surfaces of the capacitor body; and
        a second external electrode including a second connecting portion disposed on the fourth surface of the capacitor body to be connected to the plurality of the second internal electrodes, and a second band portion extending from a circumference of the second connecting portion to be connected to portions of the first and second surfaces and portions of the fifth and sixth surfaces of the capacitor body, and
    the connecting member comprises:
        first and second extensions extending from both ends of the first terminal electrode to be connected to portions of the first band portion disposed on the fifth and sixth surfaces, respectively; and
        third and fourth extensions extending from both ends of the second terminal electrode to be connected to portions of the second band portion disposed on the fifth and sixth surfaces, respectively.

3. The multilayer capacitor of claim 2, wherein a plating layer is disposed on the first and second external electrodes, the first and second terminal electrodes, and the first and second extensions.

4. The multilayer capacitor of claim 2, wherein the insulating layer is disposed to cover the first surface and portions of the third to sixth surfaces of the capacitor body.

5. The multilayer capacitor of claim 1, wherein each of the plurality of the first internal electrodes comprises a first lead-out portion and a second lead-out portion exposed to the fifth and sixth surfaces of the capacitor body, respectively, each of the plurality of the second internal electrodes comprises a third lead-out portion and a fourth lead-out portion spaced apart from the first and second lead-out portions and exposed to the fifth and sixth surfaces of the capacitor body, respectively, the plurality of external electrodes comprise:

first and second external electrodes spaced apart from each other on the fifth surface of the capacitor body, and connected to the first and third lead-out portions, respectively; and third and fourth external electrodes spaced apart from each other on the sixth surface of the capacitor body, and connected to the second and fourth lead-out portions, respectively, and the connecting member comprises first and second extensions extending from one ends of the first and second terminal electrodes to be connected to the first and second external electrodes, respectively, and third and fourth extensions extending from opposite ends of the first and second terminal electrodes to be connected to the third and fourth external electrodes, respectively.

6. The multilayer capacitor of claim 5, wherein the plurality of the first and second internal electrodes are spaced apart from the third and fourth surfaces of the capacitor body, respectively.

7. The multilayer capacitor of claim 5, wherein the first to fourth external electrodes extend from both ends thereof to be connected to portions of the first and second surfaces of the capacitor body.

8. The multilayer capacitor of claim 5, wherein a plating layer is disposed on the first to fourth external electrodes, the first and second terminal electrodes, and the first to fourth extensions.

9. The multilayer capacitor of claim 5, wherein the insulating layer is disposed to cover the first surface and portions of the third to sixth surfaces of the capacitor body.

10. The multilayer capacitor of claim 1, wherein the plurality of first and second internal electrodes are exposed to the third and fourth surfaces of the capacitor body, respectively, the plurality of external electrodes comprise:

a first external electrode including a first connecting portion disposed on the third surface of the capacitor body to be connected to the plurality of the first internal electrodes, and a first band portion extending from a circumference of the first connecting portion to be connected to portions of the first and second surfaces and portions of the fifth and sixth surfaces of the capacitor body; and a second external electrode including a second connecting portion disposed on the fourth surface of the capacitor body to be connected to the plurality of the second internal electrodes, and a second band portion extending from a circumference of the second connecting portion to be connected to portions of the first and second surfaces and portions of the fifth and sixth surfaces of the capacitor body, and the connecting member comprises first and second via electrodes penetrating through the insulating layer from the first and second terminal electrodes to be connected to portions of the first and second band portions formed on the first surface, respectively.

11. The multilayer capacitor of claim 10, wherein the insulating layer covers entire portions of the first surface of the capacitor body, except portions of the first surface through which the first and second via electrodes penetrate.

12. The multilayer capacitor of claim 10, wherein a plating layer is disposed on the first and second external electrodes and the first and second terminal electrodes.

13. A board having a multilayer capacitor mounted thereon, comprising:

a substrate including a plurality of electrode pads spaced apart from each other on the substrate; and the multilayer capacitor of claim 1, of which terminal electrodes are connected to the plurality of electrode pads, the multilayer capacitor being mounted on the substrate.

* * * * *